(12) United States Patent
Fang et al.

(10) Patent No.: US 8,402,350 B2
(45) Date of Patent: Mar. 19, 2013

(54) SYSTEM, METHOD AND APPARATUS FOR REDUCING BLOCKAGE LOSSES ON INFORMATION DISTRIBUTION NETWORKS

(75) Inventors: Weimin Fang, Stamford, CT (US); Michael J. Fischer, Stamford, CT (US); H. Lewis Wolfgang, Stamford, CT (US)

(73) Assignee: Kencast, Inc., Stamford, CT (US)

( * ) Notice: Subject to any disclaimer, the term of this patent is extended or adjusted under 35 U.S.C. 154(b) by 197 days.

(21) Appl. No.: 12/773,316

(22) Filed: May 4, 2010

(65) Prior Publication Data

US 2010/0218074 A1  Aug. 26, 2010

Related U.S. Application Data

(62) Division of application No. 11/276,225, filed on Feb. 17, 2006, now Pat. No. 7,739,580.

(60) Provisional application No. 60/654,418, filed on Feb. 17, 2005.

(51) Int. Cl.
*H03M 13/00* (2006.01)

(52) U.S. Cl. ........ 714/776; 714/752; 714/755; 714/746; 455/101; 455/103

(58) Field of Classification Search .................. 714/776, 714/752, 755, 746; 455/101, 103
See application file for complete search history.

(56) References Cited

U.S. PATENT DOCUMENTS

| | | | |
|---|---|---|---|
| 4,009,347 A | 2/1977 | Flemming et al. ............ 370/321 |
| 4,222,102 A | 9/1980 | Jansen et al. | |
| 4,525,833 A | 6/1985 | Cau et al. ........................ 370/99 |
| 4,616,338 A | 10/1986 | Helen et al. | |
| 4,718,066 A | 1/1988 | Rogard | |
| 4,907,277 A | 3/1990 | Callens et al. | |
| 5,122,988 A | 6/1992 | Graeve | |
| 5,272,675 A | 12/1993 | Kobayashi | |
| 5,388,074 A | 2/1995 | Buckenmaier | |
| 5,485,474 A | 1/1996 | Rabin | |
| 5,594,490 A | 1/1997 | Dawson et al. | |
| 5,600,663 A | 2/1997 | Ayanoglu et al. | |
| 5,617,541 A | 4/1997 | Albanese et al. | |
| 5,631,907 A | 5/1997 | Guarneri et al. | |
| 5,768,533 A | 6/1998 | Ran | |
| 5,790,524 A | 8/1998 | Bennett et al. | |
| 5,815,514 A | 9/1998 | Gray | |
| 5,903,574 A | 5/1999 | Lyons | |
| 5,959,974 A | 9/1999 | Badt et al. | |
| 6,012,159 A | 1/2000 | Fischer et al. ................ 714/755 |
| 6,031,818 A | 2/2000 | Lo | |
| 6,052,819 A | 4/2000 | Barker et al. | |

(Continued)

OTHER PUBLICATIONS

Asmuth et al., "Proceedings of the 1982 Symposium on Security and Privacy," IEEE Computer Society, Apr. 25-26, 1982, p. 156-169, Oakland CA.

(Continued)

*Primary Examiner* — Guy Lamarre
(74) *Attorney, Agent, or Firm* — Fitzpatrick, Cella, Harper & Scinto

(57) ABSTRACT

System, apparatus and method are provided for transmitting and receiving packets over first and second channels. An FEC encoder generates forward error correction (FEC) packets corresponding to an original stream of packets. A packet transmitter transmits the original stream of packets over the first channel and transmits the FEC packets over the second channel. A packet receiver receives a stream of packets over the first channel, and receives the FEC packets corresponding to the stream of packets over the second channel. An FEC decoder uses information stored in the FEC packets to determine a correspondence between the FEC packets and the stream of packets, and recovers one or more lost packets of the stream of packets using the FEC packets.

31 Claims, 4 Drawing Sheets

U.S. PATENT DOCUMENTS

| | | | |
|---|---|---|---|
| 6,104,757 A | 8/2000 | Rhee | |
| 6,141,788 A | 10/2000 | Rosenberg et al. | |
| 6,151,696 A | 11/2000 | Miller et al. | |
| 6,189,039 B1 | 2/2001 | Harvey et al. | |
| 6,249,810 B1 | 6/2001 | Kiraly | |
| 6,272,658 B1 | 8/2001 | Steele et al. | 714/752 |
| 6,289,054 B1 | 9/2001 | Rhee | |
| 6,307,487 B1 | 10/2001 | Luby | |
| 6,317,462 B1 | 11/2001 | Boyce | |
| 6,320,520 B1 | 11/2001 | Luby | |
| 6,336,200 B1 | 1/2002 | Wolfgang | 714/752 |
| 6,370,666 B1 | 4/2002 | Lou et al. | 714/751 |
| 6,373,406 B2 | 4/2002 | Luby | |
| 6,411,223 B1 | 6/2002 | Haken et al. | |
| 6,434,191 B1 | 8/2002 | Agrawal et al. | 375/227 |
| 6,445,717 B1 | 9/2002 | Gibson et al. | |
| 6,463,080 B1 | 10/2002 | Wildey | 370/508 |
| 6,486,803 B1 | 11/2002 | Luby et al. | |
| 6,496,477 B1 | 12/2002 | Perkins et al. | 370/228 |
| 6,498,821 B2 | 12/2002 | Jonas et al. | 375/347 |
| 6,526,022 B1 | 2/2003 | Chiu et al. | |
| 6,567,929 B1 | 5/2003 | Bhagavath et al. | |
| 6,567,948 B2 | 5/2003 | Steele et al. | |
| 6,570,843 B1 | 5/2003 | Wolfgang | 370/216 |
| 6,574,213 B1 | 6/2003 | Anandakumar et al. | 370/349 |
| 6,574,795 B1 | 6/2003 | Carr | |
| 6,594,798 B1 | 7/2003 | Chou et al. | |
| 6,606,723 B2 | 8/2003 | Wolfgang | |
| 6,609,223 B1 | 8/2003 | Wolfgang | 714/752 |
| 6,614,366 B2 | 9/2003 | Luby | |
| 6,671,807 B1 | 12/2003 | Jaisimha et al. | |
| 6,693,907 B1 | 2/2004 | Wesley et al. | 370/390 |
| 6,701,373 B1 | 3/2004 | Sakazawa et al. | |
| 6,735,634 B1 | 5/2004 | Geagan, III et al. | |
| 6,765,889 B1 | 7/2004 | Ludwig | |
| 6,782,490 B2 | 8/2004 | Maxemchuk et al. | |
| 6,804,244 B1 | 10/2004 | Anandakumar et al. | |
| 6,868,083 B2 | 3/2005 | Apostolopoulos et al. | 370/392 |
| 6,937,582 B1 * | 8/2005 | Kronestedt | 370/329 |
| 7,024,609 B2 | 4/2006 | Wolfgang et al. | 714/748 |
| 7,068,601 B2 | 6/2006 | Abdelilah et al. | 370/231 |
| 7,139,243 B2 | 11/2006 | Okumura | 370/248 |
| 7,315,967 B2 | 1/2008 | Azenko et al. | 714/704 |
| 7,324,578 B2 | 1/2008 | Kwon et al. | 375/135 |
| 7,418,651 B2 | 8/2008 | Luby et al. | |
| 7,425,905 B1 | 9/2008 | Oberg | 341/58 |
| 7,516,387 B2 | 4/2009 | Arnold et al. | 714/751 |
| 7,533,324 B2 | 5/2009 | Fischer et al. | 714/776 |
| 7,739,580 B1 | 6/2010 | Fang et al. | 714/776 |
| 7,796,517 B2 | 9/2010 | Chen et al. | 370/235 |
| 2001/0033611 A1 | 10/2001 | Grimwood et al. | 375/219 |
| 2001/0046271 A1 | 11/2001 | Jonas et al. | 375/347 |
| 2001/0047439 A1 | 11/2001 | Daniel et al. | |
| 2002/0035730 A1 | 3/2002 | Ollikainen et al. | 725/93 |
| 2002/0097678 A1 | 7/2002 | Bisher, Jr. et al. | 370/232 |
| 2003/0229839 A1 * | 12/2003 | Wang et al. | 714/776 |
| 2004/0025186 A1 | 2/2004 | Jennings et al. | 725/93 |
| 2004/0170201 A1 | 9/2004 | Kubo et al. | |
| 2005/0071602 A1 | 3/2005 | Niell et al. | |
| 2006/0059409 A1 | 3/2006 | Lee | 714/784 |
| 2006/0064626 A1 | 3/2006 | Fischer | |
| 2006/0253763 A1 | 11/2006 | Oliva et al. | 714/746 |
| 2007/0022361 A1 | 1/2007 | Bauer et al. | 714/776 |
| 2008/0098284 A1 | 4/2008 | Wolfgang et al. | |
| 2008/0117819 A1 | 5/2008 | Flott et al. | 370/232 |
| 2008/0244001 A1 | 10/2008 | Fang | 709/203 |
| 2008/0298271 A1 | 12/2008 | Morinaga et al. | 370/252 |
| 2009/0177948 A1 | 7/2009 | Fischer et al. | 714/776 |
| 2009/0210773 A1 | 8/2009 | Fang | 714/776 |
| 2010/0005178 A1 | 1/2010 | Sindelaru et al. | 709/228 |

OTHER PUBLICATIONS

Karnin et al., "On Secret Sharing Systems," IEEE Transactions on Information Theory, Jan. 1983, vol. IT-29, No. 1.

Mackay, David J.C., "Information Theory, Inference, and Learning Algorithms," Cambridge University Press, 2003.

Mcauley, Anthony J, "Reliable Broadband Communication Using a Burst Erasure Correcting Code," SIGCOMM '90 Symposium, Sep. 1990, p. 297-306.

Mceliece et al., "On Sharing Secrets and Reed-Solomon Codes," Communications of the ACM, Sep. 1981, vol. 24.

Miller, C Kenneth, "Reliable Multicast Protocols: A Practical View", Local Computer Networks Conference Proceedings, Nov. 1997, p. 369-378.

Rabin, Michael O, "Efficient Dispersal of Information for Security, Load Balancing, and Fault Tolerance," Journal of the Assoc. For Computing Machinery, Apr. 1998, p. 335-348, vol. 36, No. 2.

Rabin, Michael O, "Probabilistic Algorithms in Finite Fields," SIAM J. Comput., May 1980, p. 273-280, vol. 9, No. 2.

Shamir, Adi, "How to Share a Secret," Communications of the ACM, Nov. 1979, p. 612-613, vol. 22, No. 11.

* cited by examiner

Case: 2

Case: 3,4

Case: 1,2,3,4

SYSTEM, METHOD AND APPARATUS FOR REDUCING BLOCKAGE LOSSES ON INFORMATION DISTRIBUTION NETWORKS

CROSS REFERENCE TO RELATED APPLICATIONS

This application is a division of U.S. application No. 11/276,225, filed on Feb. 17, 2006, which claims priority to, and benefit of, U.S. Provisional Application No. 60/654,418, filed Feb. 17, 2005, the disclosures of which are hereby incorporated by reference herein.

BACKGROUND OF THE INVENTION

1. Field of the Invention

The present invention generally relates to communication systems, and more particularly to a system, method and apparatus for providing forward error correction in multi-links and/or multi-networks.

2. Related Art

Today, the availability of powerful digital computational tools has yielded the ability to present information in forms that go far beyond text and numbers. There now exists the capability to create and share data in more complex multimedia forms, using graphics, audio, still images and moving images (video), as well as combinations of those forms. Such data may be transferred from a host device, such as a host computer, to a potentially large number of subscriber devices, such as radio, television, mobile telephone, and computer devices.

Some subscriber devices have the ability to receive signals from different types of information distribution networks, such as satellite and wireless terrestrial networks (e.g., satellite radio, WiMax, WiFi and the like). This is useful when a subscriber device travels in and out of the realm of a particular network. For example, if a subscriber device is in an open area, it may be the case that the more powerful (or only available) signal is from a satellite broadcast network and when the subscriber device is in a metropolitan area, the strongest signal is from a terrestrial broadcast network. All such information distribution networks often experience loss of transmitted content in data streams due to blockage from such factors as the environment (e.g., rain), terrain (e.g., buildings, tunnels, etc.), and failure of network equipment.

One notable drawback of one-way satellite broadcast systems, as compared to some other methods of information distribution such as computer networks, is the inability of the subscriber devices to inform the host device that a reception error has occurred. Thus, it is essential that the transferred data be transferred in such a way that all of the subscriber devices can recover from reception errors to avoid such problems.

The above drawback of one-way broadcasting (e.g., satellite broadcasting) is further compounded by the greater vulnerability of the broadcast signal to various forms of noise interference present in the transmission channel. One form of noise that is always present in the communications channel is "white" noise. For example, white noise is introduced in the channel by the thermal radiation of the gaseous constituents of the earth's surface. The strength and frequency of this noise varies, and it sometimes overpowers the transmitted signal causing it to be received erroneously. Because of white noise, a transmitted binary "zero" bit is occasionally received erroneously as a binary "one" bit, and vice-versa. Such errors are known as bit errors. White noise generally tends to cause isolated bit errors in a transmitted message. Although these bit errors are usually spread out throughout the message, they can be easily detected and corrected, because they are isolated.

In contrast with white noise, "impulse" noise tends to wipe out long sequences of consecutive bits. Such errors are known as "burst" errors. Their duration varies from a few milliseconds to a few seconds, but certain phenomena, such as rainstorms or sunspots, can cause burst errors of even longer duration such as a few minutes. Unlike bit errors due to white noise, burst errors are not distributed over the entire message, but only a portion thereof. However, burst errors are more difficult to detect and correct, because they wipe out so many consecutive bits of data.

Well-known error detection and correction (EDAC) schemes are used to reduce the effects of errors caused by white noise. EDAC schemes generally operate at the bit level by adding enough redundant data bits to the data to detect and correct the received data. In practice, EDAC schemes can only detect and correct a limited amount of bit errors. The redundant data added to the original data, however, obviously increases the amount of data to be transmitted and thus the transmission bandwidth and transmission time. Well-known EDAC schemes include Hamming, Viturbi, Reed-Solomon, and other forward error correction (FEC) coding schemes.

Interleaving may also be performed to reduce the effects of errors in a sequence of bits. Interleaving rearranges the data bits so that they are non-sequentially transmitted. The subscriber device deinterleaves the received bits to reorder the bits as they originally appeared. Although interleaving does not in itself correct those bit errors, by non-sequentially reordering the data bits in a block of data that is to be transmitted by the host device, the bit errors are more uniformly distributed over the received block of data upon deinterleaving by the subscriber device. By isolating the bit errors, interleaving enhances bit-level EDAC coding performance. Both EDAC and interleaving can also be performed on data symbols representing groups of bits, such as bytes.

In most broadcast systems, the transmitted data bits or symbols are most likely to be organized into large groups called packets, and a large data file is transmitted as a sequence of packets. The addressed subscriber devices reconstruct the large data file from the received packets. The above-described noise bursts can typically damage one or more long sequences of consecutive packets. Those packets are either not received by one or more of the subscriber devices or are received severely corrupted. Although bit-level EDAC schemes might be able to correct some of the corrupted packets, depending on the number of erroneous bits in those corrupted packets, these schemes are simply not robust enough to correct the great majority of those corrupted packets. This is because, in extended periods of burst noise, a large amount of both the original data bits and redundant EDAC bits in a packet are received corrupted, thus making bit-level error correction, and thus packet-level error-correction, impossible. Moreover, EDAC schemes are useless in the case of those packets not received.

One known method for reducing the effect of burst errors in such broadcast systems is retransmission of those packets that were not received or were received corrupted and could not be corrected (hereinafter those packets are simply referred to as "lost"). For example, a host device may broadcast via satellite to two geographically widely-separated subscriber devices A and B. Due to this wide separation, subscriber device A and subscriber device B may experience different weather conditions, and thus different patterns of noise. For example, subscriber device A may lose 20% of the transmitted packets, while subscriber computer B may successfully receive all the transmitted packets. Although it is possible to rebroadcast an entire file of data to all the subscriber devices, current methods of doing this are costly, waste time and bandwidth, and prevent communications channels from being used for other purposes.

In the above example, subscriber device A would identify the lost packets (by examining the serial numbers of the correctly received packets) and would ask the host device to retransmit the packets it missed until the entire large data file could be reconstructed perfectly by subscriber computer A. In the satellite broadcast example given above, the request for missed packet retransmission is made through a back channel, and the host device rebroadcasts those missed packets via the satellite. Alternatively, the host device retransmits those missed packets only to subscriber device A through the back channel.

Retransmission of lost packets requires, however, (1) two-way communication back channels from all of the subscriber devices to the host device so each subscriber computer can inform the host device of which packets were lost, and (2) a retransmission protocol between the host device and the subscriber devices. Each back channel usually takes the form of a modem and telephone lines, or is part of a standard computer network. The back channel therefore has a limited bandwidth and can timely transmit only a limited amount of information. Back channels are also expensive. Further, retransmission increases the time required to distribute the data, and prevents the host device and subscriber devices from doing other tasks. In some applications, such as a mobile receiver, use of back channels may simply be impossible.

As the use of live data streams increases, for example, on the Internet, or through satellite and wireless networks, the need to protect those streams upon transmission with minimal delay and bandwidth, so as to permit perfect reconstruction and recording of the same upon reception, becomes even greater.

Given the foregoing, what is needed is a solution that reduces or entirely eliminates the effect of blockages in multi-links/multi-networks.

BRIEF DESCRIPTION OF THE INVENTION

The present invention meets the above-identified needs by providing a system, method and computer program product for reduction of blockage losses on information distribution networks.

The system of the present invention may include a host computer and/or one or more client computers. The host computer captures a packet stream, and encodes it using one or more of the forward error correction ("FEC") techniques such as those described in the U.S. Pat. Nos. 6,012,159, 6,272,658, 6,336,200, 6,570,843 and 6,609,223 and U.S. patent application Ser. Nos. 10/126,119, filed Apr. 19, 2002, and 11/233,440, filed on Sep. 22, 2005, each patent and application of which is incorporated herein by reference. This FEC-encoded stream is then transmitted, for example, by satellite or other wireless network, to one or more client computers. Upon reception, a client computer reconstructs the packet stream to correct for any outage damage (missing packets), again using one or more of the techniques such as those described in U.S. Pat. Nos. 6,012,159, 6,272,658, 6,336,200, 6,570,843 and 6,609,223 and U.S. patent application Ser. Nos. 10/126,119, filed Apr. 19, 2002, and 11/233,440, filed on Sep. 22, 2005. The reconstructed packet stream may then be played back, through standard browsers, mobile device, radio, or other appropriate playback engine, or rebroadcast as it is reconstructed. In addition, the packet stream may be digitally recorded to a file. Those files may be subsequently played back or rebroadcast.

In addition, after a packet stream is initially captured to a local file, if the reconstruction is not perfect, the receiver can interact with the host computer through a back channel to repair any remaining defects in the local file by retrieving missing (lost) packets, and return a certification that the file is flawless and ready for rebroadcast. In addition, as a packet stream is being recorded into the file, it may also be dynamically indexed.

In one aspect of the invention, systems, methods, apparatus and computer program products are provided for transmitting packets over first and second channels. An FEC encoder generates forward error correction (FEC) packets corresponding to an original stream of packets and a packet transmitter transmits the original stream of packets over the first channel and the FEC packets over the second channel.

In another aspect of the invention, systems, methods, apparatus and computer program products are provided for transmitting packets over first and second channels. An FEC encoder marks an original stream of packets to generate a marked stream of packets and generates FEC packets corresponding to the marked stream of packets. A packet transmitter transmits the marked stream of packets over the first channel and the FEC packets over the second channel.

In another aspect of the invention, systems, methods, apparatus and computer program products are provided for transmitting packets over first and second channels. An FEC encoder marks an original stream of packets to generate a marked stream of packets, and generates FEC packets corresponding to the marked stream of packets. A packet transmitter transmits a first portion of the marked stream of packets over the first channel and a second portion of the marked stream of packets over the second channel, and transmits a first portion of the FEC packets over the first channel and the remainder of the FEC packets over the second channel.

In yet another aspect of the invention, systems, methods, apparatus and computer program products are provided for transmitting packets over first and second channels. An FEC encoder calculates an FEC contribution of each packet of an original stream of packets, and generates FEC packets in accordance with the FEC contribution of each packet of the original stream of packets. A transmitter transmits a block of the original stream of packets over the first channel, and transmits FEC packets over the second channel.

In another aspect of the invention, systems, methods, apparatus and computer program products are provided for receiving packets from first and second channels. A packet receiver receives a marked stream of packets over the first channel, where each packet of the marked stream of packets contains a marking. The packet receiver also receives FEC packets corresponding to the marked stream of packets over the second channel. An FEC decoder recovers one or more lost packets of the marked stream of packets using the FEC packets.

In another aspect of the invention, systems, methods, apparatus and computer program products are provided for receiving packets from first and second channels. A packet receiver receives a stream of marked packets over the first channel and receives FEC packets over the second channel. An FEC decoder extracts a time window for each packet of the marked stream of packets from a corresponding FEC packet. The FEC decoder also discards an FEC packet if its time window has expired. In addition, the FEC decoder recovers one or more lost packets of the stream of marked packets using the FEC packets, thereby substantially reconstructing an original stream of packets.

In still another aspect of the present invention, systems, apparatus, methods and computer program products are provided for receiving packets from first and second channels. A packet receiver receives a stream of packets over the first channel, and receives FEC packets corresponding to the stream of packets over the second channel. An FEC decoder uses information stored in the FEC packets to determine a correspondence between the FEC packets and the stream of packets, and recovers one or more lost packets of the stream of packets using the FEC packets.

Further features and advantages of the present invention as well as the structure and operation of various embodiments of the present invention are described in detail below with reference to the accompanying drawings.

BRIEF DESCRIPTION OF THE DRAWINGS

The features and advantages of the present invention will become more apparent from the detailed description set forth below when taken in conjunction with the drawings in which like reference numbers indicate identical or functionally similar elements. Additionally, the left-most digit of a reference number identifies the drawing in which the reference number first appears.

DETAILED DESCRIPTION

The present invention is now described in more detail herein in terms of an exemplary system, method, apparatus and computer program products for reducing or entirely eliminating the effect of blockages in live streams in networks.

This is for convenience only and is not intended to limit the application of the present invention. In fact, after reading the following description, it will be apparent to one skilled in the relevant art(s) how to implement the following invention in alternative embodiments (e.g., in systems that transmit and receive content in the form of files; in systems which perform transmission over more than two networks; etc.).

Generally, the present invention adds forward error correction (FEC) onto an original stream of packets. The original stream of packets is transmitted on a first channel and a stream of FEC information is transmitted independently without affecting the original stream. Hence a system without the ability to receive or decode the FEC encoded stream can still play back information received from the original stream of packets. A receiver device capable of handling the FEC decoding, however, will have improved quality of service.

Figure 1A:
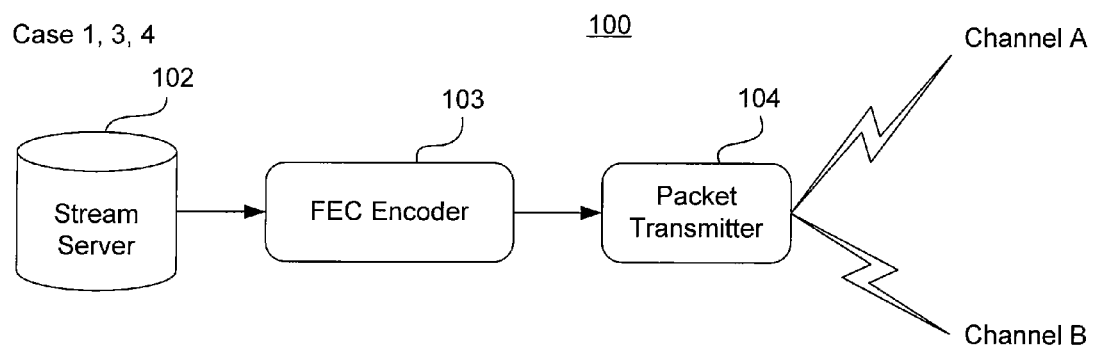
FIG. 1A is a block diagram of an exemplary transmitter structure in accordance with one embodiment of the present invention.

FIG. 1A is a block diagram of an exemplary transmitter 100 in accordance with one embodiment of the present invention.

Transmitter 100 includes a stream server 102 for producing an original stream of packets. Transmitter 100 also includes an FEC encoder 103 for FEC encoding data streams, and a two-channel packet transmitter 104. The original stream of packets is fed by stream server 102 to FEC encoder 103 which, in turn, FEC encodes the original stream of packets. The FEC encoded packets are fed to packet transmitter 104, which is configured to transmit them onto one or two transmission channels, Channel A and Channel B. FEC encoder 103 is also capable of only marking the packets, leaving the payload of the original stream of packets unmodified.

Packet marking can be accomplished in different ways. For example, identification information can be stored in fields of the packet headers. Alternatively, an original packet can be wrapped within another packet structure having its header used to identify the original packet. Accordingly, different methods of marking can be utilized and still be within the scope of this invention.

The original (marked) stream of packets are also be fed to packet transmitter 104 and transmitted through either of its two channels.

Figure 1B:
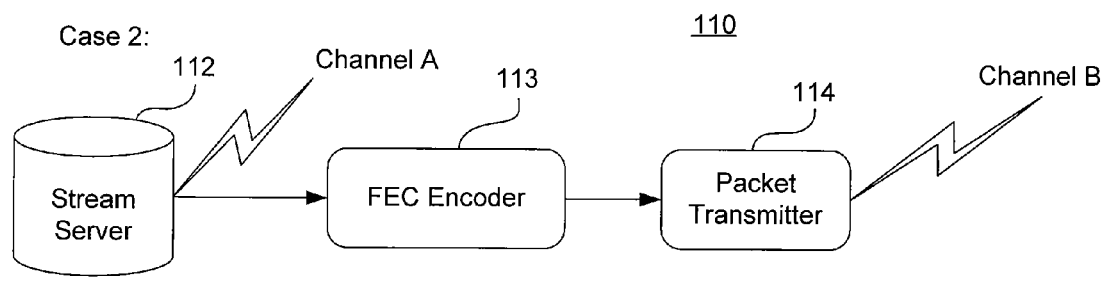
FIG. 1B is a block diagram of an exemplary transmitter structure in accordance with one embodiment of the present invention.

FIG. 1B is a block diagram of an exemplary transmitter 110 in accordance with another embodiment of the present invention. Transmitter 110 includes a stream server 112 capable of producing an original stream of packets and transmitting them through a first channel, Channel A. Transmitter 110 also includes an FEC encoder 113 and a packet transmitter 114. Stream server 112 feeds the original stream of packets to FEC encoder 113 which FEC encodes them. In turn, the FEC encoded packets are fed to a packet transmitter 114 for transmission through a second channel, Channel B.

In both of the aforementioned transmitters 100 and 110, FEC encoders 103 and 113 can be programmed to use any FEC encoding techniques known in the art, including those described in U.S. Pat. Nos. 6,012,159, 6,272,658, 6,336,200, 6,570,843 and 6,609,223 and U.S. patent application Ser. Nos. 10/126,119, filed Apr. 19, 2002, and 11/233,440, filed on Sep. 22, 2005, all of which are incorporated herein by reference.

Transmitters 100 and 110 can operate in different modes (referred to herein as "cases"). Referring to FIG. 1A, in a first case, stream server 102 feeds the original stream of packets to FEC encoder 103 which marks them (e.g., by placing identifier information in the packet headers). In turn, the marked original stream of packets is fed by FEC encoder 103 to packet transmitter 104 which transmits the marked original stream of packets through Channel A. The original stream of packets are also FEC encoded by FEC encoder 103. Transmitter 104, in turn, transmits the FEC encoded packets it receives from FEC encoder 103 through Channel B.

Referring to FIG. 1B, in a second case, a stream server 112 transmits the original stream of packets, unmarked, to a receiving device through a first channel, Channel A. In addition, stream server 112 feeds the original stream of packets to FEC encoder 113 which FEC encodes the original stream of packets. In turn, FEC encoder 113 feeds the FEC encoded packets to packet transmitter 114 which transmits them through a second channel, Channel B. The original stream of packets are identified for example, by generating a fingerprint of the original stream of packets to determine the sequence of source packets that generated the FEC packets, the fingerprints being stored in the FEC packets. It should be understood that other information corresponding to the original packets (e.g., a checksum of the original packets, a Hash value of the individual packet, and the like) can be stored in the FEC packets to map them with their corresponding original packets.

Referring again to FIG. 1A, in a third case, stream server 102 feeds the original stream of packets to FEC encoder 103 which marks them with identification information. The marked original stream of packets is, in turn, fed to packet transmitter 104. FEC encoder 103 also FEC encodes the original stream of packets and feeds transmitter 104 the FEC encoded packets. The marked original packets and some of the FEC encoded packets are then transmitted by transmitter 104 through a first channel, Channel A. The remainder of the FEC encoded packets are transmitted by transmitter 104 through a second channel, Channel B.

In one exemplary implementation a receiver 320 receives Channel A and Channel B from two 802.11B NICs. As is well known, transmission using the 802.11B protocol can sometimes be unreliable because packets are dropped quite often. The present invention uses two channels, however, to detect and correct the dropped packets.

In a fourth case, stream server 102 feeds the original stream of packets to FEC encoder 103 which marks them with identification information. The marked original stream of packets is, in turn, fed to packet transmitter 104. FEC encoder 103 also FEC encodes the original stream of packets. The marked original packets and the FEC encoded packets are then fed to transmitter 104, which transmits the marked original stream through both Channel A and Channel B, and transmits each of the FEC encoded packets through Channel A or Channel B. In another embodiment of the fourth case, a portion of the original stream of packets are transmitted on Channels A and B. The portions transmitted need not be the same.

In both transmitter 100 and 110, the rate of FEC packets is adjustable at run time. Thus, FEC encoder (103, 113) can modify the FEC rate without interrupting the receiving device. This is advantageous, for example, in network systems where there is a return link from the receiving device that can report the quality of reception from Channel A and Channel B. If necessary, FEC encoder (103, 113) will adjust the ratio of FEC to provide higher quality of service while efficiently using the bandwidth on Channel B. More particularly, the FEC encoder determines an FEC ratio to specify how many FEC packets to generate for a block of the original stream of packets. The rate of FEC can be any non-negative integer. For example, if the rate is N, then the number of FEC packets sent on Channel B will be N % of the number of packets send on Channel A.

Figure 2:
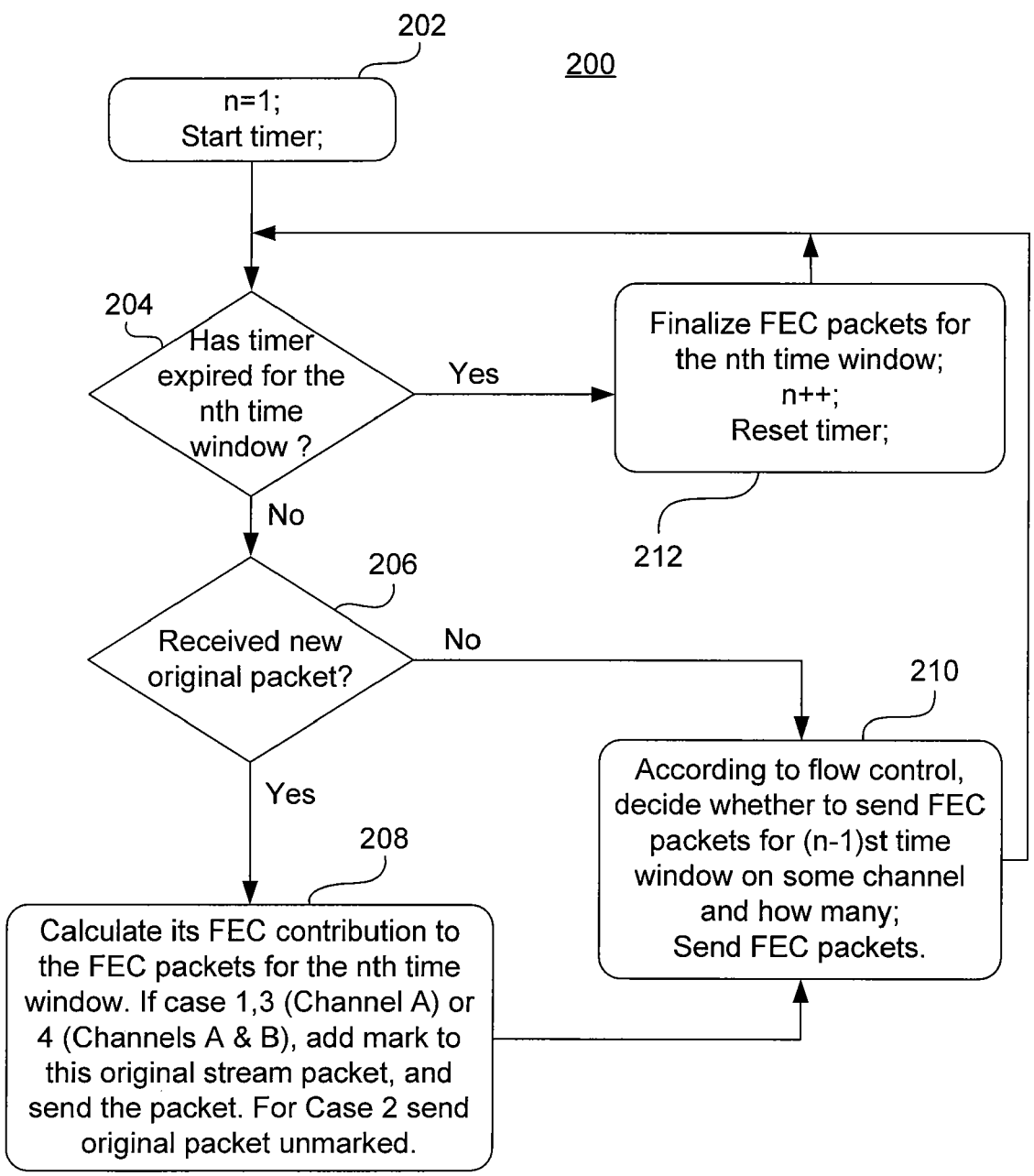
FIG. 2 is a flowchart illustrating a transmitter process according to one embodiment of the present invention.

Referring to FIG. 2, a flowchart illustrating a transmission process 200, according to one embodiment of the present invention, is shown.

Generally, before each packet of the original stream of packets is transmitted onto Channel A, its contribution to the FEC packets is calculated. After transmitting out a block of the original stream of packets within a period of time (referred to herein below as a "time window"), FEC packets are transmitted for this time window of packets. Simultaneously with the transmission of the FEC packets, another time window of the original stream of packets is transmitted on Channel A. Flow control is used by the packet transmitter (100, 110) to ensure FEC packets for a previous time window are sent out evenly on Channel B before the next time window of original stream of packets is sent out on Channel A (i.e., before the next time window has expired).

Initially, at step 202, a variable representing time window n is initialized and a timer for keeping track of time window is started. During time window n the original stream of packets are fed from the stream server (102, 112). A determination is made at step 204 as to whether the time corresponding to a particular (i.e., nth) time window has expired. If not, then the transmitter (100, 110), makes a determination at step 206 whether a new original packet has been received. If determination at step 206 has been made that a new original packet has not been received, then at step 210 the transmitter's FEC encoder flow control operates to determine whether to send FEC packets corresponding to the (n−1)st time window onto a channel and how many such FEC packets to send. If a determination has been made at step 206 that a packet has been received, at step 208 that packet's FEC contribution to the FEC packets corresponding to a block of packets is calculated for the nth time window. The contribution of each source packet can be calculated either independently or as a group. For example, if the contribution of each source packet is calculated independently, then at the end of a time window the contributions can be summed together using a running sum. If the contribution of a time window of original packets is calculated as a group, a buffer can be used to store the original packets and at the end perform the FEC packet calculations on the group's contribution.

In addition, at step 208, the original stream packet is marked as described above with respect to cases 1, 3 and 4, and transmitted on Channel A in cases 1 and 3 and on Channels A and B in case 4. In case 2, the original packet is transmitted on Channel A regardless of its contribution.

After step 208, the process proceeds to step 210 where the FEC encoder flow control operates to decide whether to send FEC packets for the (n−1)st time window on a channel, and, how many such FEC packets to send and sends them.

If a determination has been made at step 204 that the time window has expired for the nth time window, then at step 212 the FEC packets for the nth time window are finalized.

During time window n, while the original stream of packets is being transmitted, FEC packets are being computed. Thus, the FEC packets for a time window n are sent during time window n+1.

Figure 3A:
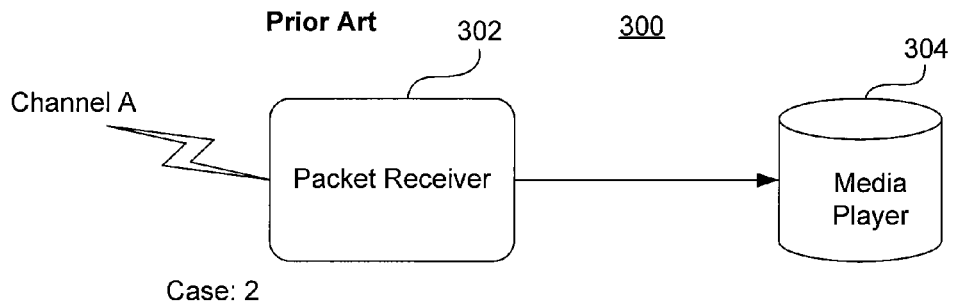
FIG. 3A is a block diagram of a prior art receiver structure.

Receiver 300, 310, and 320 in accordance with the present invention will now be discussed in detail with reference to FIGS. 3A, 3B and 3C, respectively. Generally, receiver structures that have two receive channels can use packets from one channel to recover lost packets in another channel. A receiving device capable of receiving the first and second channels uses the FEC encoded packets to repair the original stream as necessary.

As described above, in case 2 the original stream of packets is transmitted over Channel A unmarked. In addition, case 2 provides for transmitting FEC encoded packets over Channel B. FIG. 3A depicts is a prior art receiver 300 capable of receiving an original stream of packets transmitted in accordance with case 2. Receiver 300 includes a packet receiver 302 capable of receiving the original stream packets from Channel A. Receiver 300 also includes a media player 304. Packet receiver 302 is fed the original stream from Channel A and communicates the information to a suitable media player 304 for reproducing the content of the original stream. While FIG. 3A is identified as prior art, it is illustrated here to show that data streams encoded in accordance with the present invention in case 2 (described above) are capable of being received by a standard receiver, hence making the transmitter in accordance with case 2 of the present invention backwards compatible. Particularly, receiver 300 can receive packets transmitted in accordance with case 2 because the FEC is overlayed and added as an enhancement to an existing system without affecting the receiver 300 from receiving original streams of packets normally.

In another embodiment of cases 1, 3 and 4 described above, marking information may be stored in user defined fields in the original stream of packets and thus ignored by the decoding algorithms in Receiver 300. Accordingly, receiver 300 would also still receive an original stream of packets transmitted by transmitter 100 using these alternative cases 1, 3, and 4.

Figure 3B:
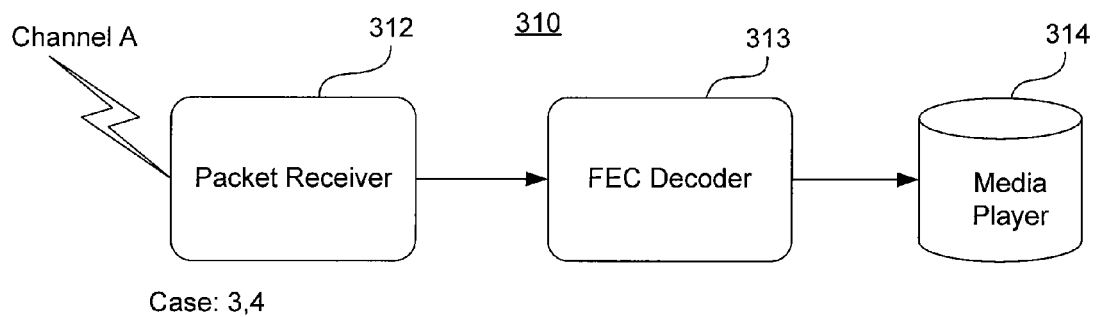
FIG. 3B is a block diagram of an exemplary receiver structure in accordance with one embodiment of the present invention.

FIG. 3B is a block diagram of an exemplary receiver 310 in accordance with one embodiment of the present invention. Receiver 310 includes a packet receiver 312, an FEC decoder 313 and a media player 314. Packet receiver 312 is capable of receiving original streams of packets and FEC encoded packets. The FEC packets are fed to an FEC decoder 313 for decoding. FEC decoder also uses the marking information in the header of the original stream of packets to correlate the original stream of packets with the FEC encoded packets. In turn, FEC decoder 313 feeds the decoded packet to a media player 304 for playback of the original content.

Figure 3C:
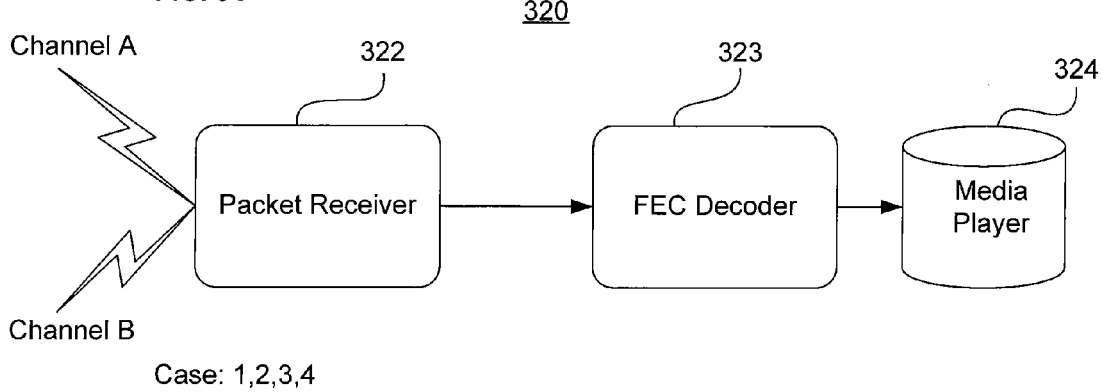
FIG. 3C is a block diagram of an exemplary receiver structure in accordance with one embodiment of the present invention.

FIG. 3C is a block diagram of an exemplary receiver structure 320 in accordance with another embodiment of the present invention. Receiver 320 includes a packet receiver 322, an FEC decoder 323 and a media player 324. Packet receiver 322 is capable of receiving FEC encoded packets and original streams of packets from two channels, Channel A and Channel B. FEC encoded packets are fed to FEC decoder 323, which decodes them. FEC decoder also uses the marking information in the header of the original stream of packets to correlate the original stream of packets with the FEC encoded packets. In turn, the decoded packets are fed to a media player 324 which reproduces the original content.

Generally, receiver 320 receives packets from both Channel A and Channel B, and uses the FEC packets from Channel B to recover any lost packets on Channel A to improve the quality of playback.

Figure 4:
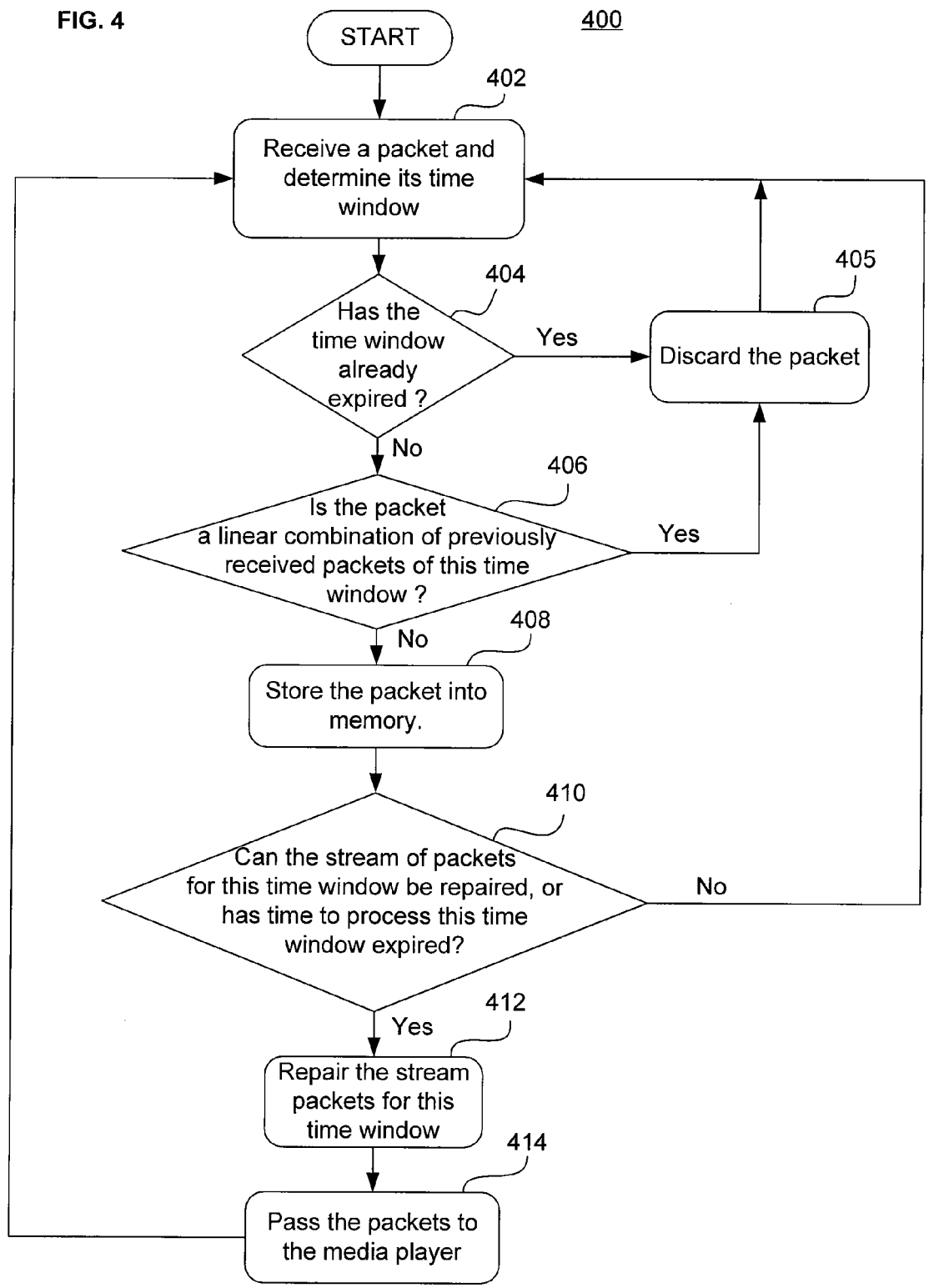
FIG. 4 is a flowchart illustrating a receiver process according to one embodiment of the present invention.

Referring to FIG. 4, a flowchart illustrating a reception process 400, according to one embodiment of the present invention, is shown. Generally, the receiver 320 buffers the original stream of packets and FEC packets for a time window. If there are some lost packets on the original stream of packets, the receiver will use FEC packets to recover the missing packets.

Initially, at step 402, a packet is received and the packet receiver determines its time window. A packet's time window can be established in several ways, depending on which case (1 through 4) has been implemented at the transmitter side. For example, in cases, 1, 3 and 4 the packets can include header information describing that packet's time window. In case 2, where the packets are not marked, the FEC decoder determines information as to the original stream packets according to their corresponding FEC packets using well known techniques for matching FEC packets with their corresponding source packets.

Next, at step 404 a determination is made whether the time window has expired. If so, then at step 405 that packet is discarded. This may be the case, for example, when a packet has been received out of order. If the time window has not yet expired, then at step 406 a determination is made whether the packet is a linear combination of previously received packets of this time window and hence redundant. If so, then at step 405 the packet is discarded.

If the packet is not a linear combination of previously received packets of the time window, at step 408 the packet is stored into a memory. Next, at step 410, a determination is made whether the stream of packets for the time window can be repaired. Step 410 also makes the determination as to whether the time to process the stream of packets for the time window has expired. If the result of either question is affirmative, then the stream of packets are repaired for this time window at step 412 and the repaired packets are passed to the media player (314, 324). The process then proceeds to step 402 to restart process 400. If a determination was made at step 410 that the stream of packets for the time window cannot be repaired, or that the time to process the time window has not expired, then process 400 proceeds to step 402 and process 400 restarts.

For receiver devices that do not receive FEC packets, the packets received will be delivered to a corresponding media player immediately. It follows that if some packets are lost, the quality of playback will likely suffer.

While various embodiments of the present invention have been described above, it should be understood that they have been presented by way of example, and not limitation. It will be apparent to persons skilled in the relevant art(s) that various changes in form and detail can be made therein without departing from the spirit and scope of the present invention. Thus, the present invention should not be limited by any of the above described exemplary embodiments, but should be defined only in accordance with the following claims and their equivalents.

Further, the purpose of the foregoing Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract is not intended to be limiting as to the scope of the present invention in any way. It is also to be understood that the steps and processes recited in the claims need not be performed in the order presented.

What is claimed is:

1. A method for transmitting packets over first and second channels, comprising the steps of:
   generating a plurality of forward error correction (FEC) packets corresponding to an original stream of packets;
   transmitting the original stream of packets over the first channel; and
   transmitting the plurality of FEC packets over the second channel,
   wherein the transmitting the original stream of packets and the transmitting the plurality of FEC packets occur simultaneously.

2. The method of claim 1, wherein the first and second channels are on the same network.

3. The method of claim 1, wherein the first and second channels are on independent networks.

4. The method of claim 3, wherein the independent networks are selected from the group consisting of a satellite network and a terrestrial wireless network.

5. A method for transmitting packets over first and second channels, comprising the steps of:
   calculating a forward error correction (FEC) contribution of each packet of an original stream of packets;
   generating a plurality of FEC packets in accordance with the FEC contribution of each packet of the original stream of packets;
   transmitting a block of the original stream of packets over the first channel; and
   transmitting the plurality of FEC packets over the second channel,
   wherein the transmitting the block of the original stream of packets and the transmitting the plurality of FEC packets occur simultaneously.

6. The method of claim 5, wherein the first and second channels are on the same network.

7. The method of claim 5, wherein the first and second channels are on independent networks.

8. The method of claim 5, further comprising the steps of:
  transmitting a block of the original stream of packets during a first time window; and
  transmitting the plurality of FEC packets during a second time window.

9. A method for receiving packets from first and second channels, comprising the steps of:
  receiving a stream of packets over the first channel;
  receiving a plurality of forward error correction (FEC) packets corresponding to the stream of packets over the second channel,
  wherein the receiving the stream of packets and the receiving the plurality of FEC packets occur simultaneously;
  using information stored in the plurality of FEC packets to determine a correspondence between the plurality of FEC packets and the stream of packets; and
  recovering one or more lost packets of the stream of packets using the plurality of FEC packets.

10. The method of claim 9, wherein the first and second channels are on the same network.

11. The method of claim 9, wherein the first and second channels are on independent networks.

12. The method of claim 11, wherein the independent networks are selected from the group consisting of a satellite network and a terrestrial wireless network.

13. A transmitter for transmitting packets over first and second channels, comprising:
  an FEC encoder operable to generate a plurality of forward error correction (FEC) packets corresponding to an original stream of packets; and
  a packet transmitter operable to transmit the original stream of packets over the first channel and to transmit the plurality of FEC packets over the second channel,
  wherein the packet transmitter is operable to simultaneously transmit the original stream of packets and the plurality of FEC packets.

14. The transmitter of claim 13, wherein the first and second channels are on the same network.

15. The transmitter of claim 13, wherein the first and second channels are on independent networks.

16. The transmitter of claim 15, wherein the independent networks are selected from the group consisting of a satellite network and a terrestrial wireless network.

17. A transmitter for transmitting packets over first and second channels, comprising:
  an FEC encoder operable to calculate a forward error correction (FEC) contribution of each packet of an original stream of packets, and to generate a plurality of FEC packets in accordance with the FEC contribution of each packet of the original stream of packets; and
  a packet transmitter operable to transmit a block of the original stream of packets over the first channel, and to transmit the plurality of FEC packets over the second channel,
  wherein the packet transmitter is operable to simultaneously transmit the block of the original stream of packets and the plurality of FEC packets.

18. The transmitter of claim 17, wherein the first and second channels are on the same network.

19. The transmitter of claim 17, wherein the first and second channels are on independent networks.

20. The transmitter of claim 17, wherein the transmitter is further operable to transmit a block of the original stream of packets during a first time window, and to transmit the plurality of FEC packets during a second time window.

21. A receiver for receiving packets from first and second channels, comprising:
  a packet receiver operable to receive a stream of packets over the first channel, and to receive a plurality of forward error correction (FEC) packets corresponding to the stream of packets over the second channel,
  wherein the packet receiver is operable to simultaneously receive the stream of packets and the plurality of FEC packets; and
  an FEC decoder operable to use information stored in the plurality of FEC packets to determine a correspondence between the plurality of FEC packets and the stream of packets, and to recover one or more lost packets of the stream of packets using the plurality of FEC packets.

22. The receiver of claim 21 wherein the first and second channels are on the same network.

23. The receiver of claim 21, wherein the first and second channels are on independent networks.

24. The receiver of claim 23, wherein the independent networks are selected from the group consisting of a satellite network and a terrestrial wireless network.

25. A computer program product comprising a computer usable medium having control logic stored therein for causing a computer to transmit packets over first and second channels, said control logic comprising:
  first computer readable program code means for causing the computer to calculate a forward error correction (FEC) contribution of each packet of an original stream of packets;
  second computer readable program code means for causing the computer to generate a plurality of FEC packets in accordance with the FEC contribution of each packet of the original stream of packets;
  third computer readable program code means for causing the computer to transmit a block of the original stream of packets over the first channel; and
  fourth computer readable program code means for causing the computer to transmit the plurality of FEC packets over the second channel,
  wherein the block of the original stream of packets and the plurality of FEC packets are transmitted simultaneously.

26. The computer program product of claim 25, further comprising:
  fifth computer readable program code means for causing the computer to transmit a block of the original stream of packets during a first time window; and
  sixth computer readable program code means for causing the computer to transmit the plurality of FEC packets during a second time window.

27. A computer program product comprising a computer usable medium having control logic stored therein for causing a computer to receive packets from first and second channels, said control logic comprising:
  first computer readable program code means for causing the computer to receive a stream of packets over the first channel;
  second computer readable program code means for causing the computer to receive a plurality of forward error correction (FEC) packets corresponding to the stream of packets over the second channel,
  wherein the stream of packets and the plurality of FEC packets are received simultaneously;
  third computer readable program code means for causing the computer to use information stored in the plurality of FEC packets to determine a correspondence between the plurality of FEC packets and the stream of packets; and fourth computer readable program code means for causing the computer to recover one or more lost packets of the stream of packets using the plurality of FEC packets.

28. A system for transmitting and receiving packets over first and second channels, comprising:
- an FEC encoder operable to generate a plurality of forward error correction (FEC) packets corresponding to an original stream of packets;
- a packet transmitter operable to transmit the original stream of packets over the first channel and to transmit the plurality of FEC packets over the second channel, wherein the transmitting the original stream of packets and the transmitting the plurality of FEC packets occur simultaneously;
- a packet receiver operable to receive the original stream of packets over the first channel, and to receive the plurality of FEC packets over the second channel; and
- an FEC decoder operable to use information stored in the plurality of FEC packets to determine a correspondence between the plurality of FEC packets and the original stream of packets, and to recover one or more lost packets of the original stream of packets using the plurality of FEC packets.

29. The system of claim 28 wherein the first and second channels are on the same network.

30. The system of claim 28, wherein the first and second channels are on independent networks.

31. The system of claim 30, wherein the independent networks are selected from the group consisting of a satellite network and a terrestrial wireless network.

* * * * *

UNITED STATES PATENT AND TRADEMARK OFFICE
CERTIFICATE OF CORRECTION

| | |
|---|---|
| PATENT NO. | : 8,402,350 B2 |
| APPLICATION NO. | : 12/773316 |
| DATED | : March 19, 2013 |
| INVENTOR(S) | : Weimin Fang |

It is certified that error appears in the above-identified patent and that said Letters Patent is hereby corrected as shown below:

In the Specification

COLUMN 2:

Line 19, "amount" should read --number--.

COLUMN 7:

Line 64, "are" should read --is--.

COLUMN 8:

Line 26, "(n-1)st" should read --(n-1)th time--;
    Line 35, "Receiver" should read --Receivers--; and
    Line 46, "is" should be deleted.

In the Claims

COLUMN 12:

Line 15, "claim 21" should read --claim 21,--.

COLUMN 14:

Line 7, "claim 28" should read --claim 28,--.

Signed and Sealed this
Fifteenth Day of April, 2014

Michelle K. Lee
*Deputy Director of the United States Patent and Trademark Office*